US008423877B2

(12) United States Patent
Thoumy et al.

(10) Patent No.: US 8,423,877 B2
(45) Date of Patent: Apr. 16, 2013

(54) METHOD FOR DETERMINING A COPY TO BE DECODED AND AN ASSOCIATED ERASURES VECTOR, CORRESPONDING STORAGE MEANS AND RECEIVER DEVICE

(75) Inventors: Francois Thoumy, Vignoc (FR); Mounir Achir, Cesson-Sevigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 340 days.

(21) Appl. No.: 12/957,707

(22) Filed: Dec. 1, 2010

(65) Prior Publication Data

US 2011/0131475 A1 Jun. 2, 2011

(30) Foreign Application Priority Data

Dec. 1, 2009 (FR) ...................................... 09 58559

(51) Int. Cl.
*H03M 13/03* (2006.01)

(52) U.S. Cl.
USPC ........................................................ 714/786

(58) Field of Classification Search .................. 714/774, 714/776, 780, 786, 795
See application file for complete search history.

(56) References Cited

U.S. PATENT DOCUMENTS

| 6,065,149 A | 5/2000 | Yamanaka | 714/780 |
| 6,301,681 B1 | 10/2001 | Chen et al. | 714/751 |
| 6,389,573 B1 | 5/2002 | Weng | 714/784 |
| 7,228,489 B1 | 6/2007 | Boyer | 714/784 |
| 2003/0139140 A1 | 7/2003 | Chen et al. | 455/67.1 |
| 2007/0089038 A1 | 4/2007 | Xu et al. | 714/776 |
| 2007/0115801 A1 | 5/2007 | Li et al. | 370/208 |

FOREIGN PATENT DOCUMENTS

| EP | 0 759 167 A1 | 2/1997 |
| EP | 0 844 741 A2 | 5/1998 |
| GB | 2 185 367 A | 7/1987 |
| WO | WO 2004/038931 A2 | 5/2004 |
| WO | WO 2005/034413 A1 | 4/2005 |

OTHER PUBLICATIONS

Bigloo et al., Maximum likelihood decoding and code combining for DS/SSMA slotted ALOHA, Dec. 1997, IEEE Trans on Comm. vol. 45, No. 12, p. 1602-1612.*
Viterbi, A.J., "Error Bounds for Convolutional Codes and an Asymptotically Optimum Decoding Algorithm", IEEE Trans. on Information Theory, vol. IT-13, No. 2, pp. 260-269 (Apr. 1967).
Omura, J.K., "On the Viterbi Algorithm", IEEE Trans. on Information Theory, vol. 15, No. 1, pp. 177-179 (Jan. 1969).
Battail, G., "Weighting of the symbols decoded by the Viterbi algorithm", Ann. Telecomm. vol. 42, No. 1-2, pp. 31-38 (1987).
Hagenauer, J., et al., "A Viterbi algorithm with soft-decision outputs and its applications," in Proc. IEEE Global Telecommunications Conference 1989, Dallas, Texas, pp. 1680-1686 (Nov. 1989).
Sfez, R., et al,. "A Weighted-Output Variant of the Viterbi Algorithm for Concatenated Schemes Using a Convolutional Inner Code", in Proc. Eurocode '90, Udine, Italy, pp. 259-270 (Nov. 1990).
T. Aaron Gulliver, "Diversity Combining and Reed-Solomon Coding for Fast Frequency Hopped Noncoherent *MFSK*", Proceedings of the IEEE Military Communications Conference, Sep. 30, 1990, pp. 106-110.

* cited by examiner

*Primary Examiner* — Shelly A Chase
(74) *Attorney, Agent, or Firm* — Fitzpatrick, Cella, Harper & Scinto

(57) ABSTRACT

A method is proposed for determining an erasures vector associated with a data block to be decoded built out of received copies, and using levels of reliability of transmission associated with symbols contained in different copies of a same block of received pieces of data.
Such a method advantageously makes reduces the error rate at output of a decoder by minimizing the operations to be performed to determine the erasures vector, marking the erasures and preventing the generation of an excessively large number of erasures (even when the transmission of certain received copies is unreliable) to have a number of erasures that does not exceed the correction capacity of the decoder.

13 Claims, 8 Drawing Sheets

| Ind1 | Ind2 | ind3 | ind4 | Rel1 | Rel2 | Rel3 | Rel4 | Rel mean |

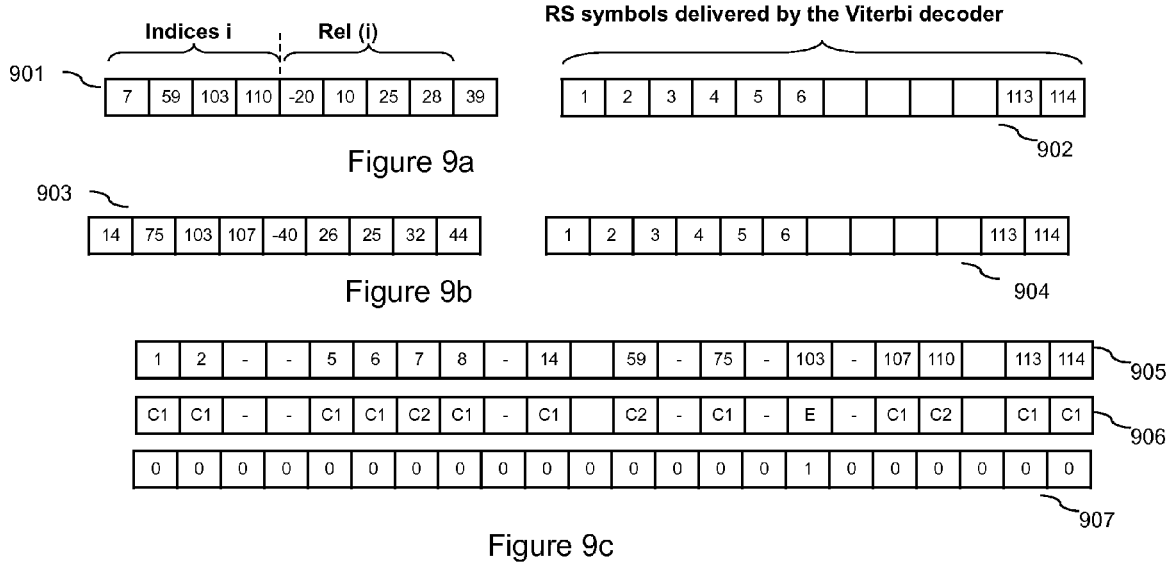
Figure 9a
Figure 9b
Figure 9c
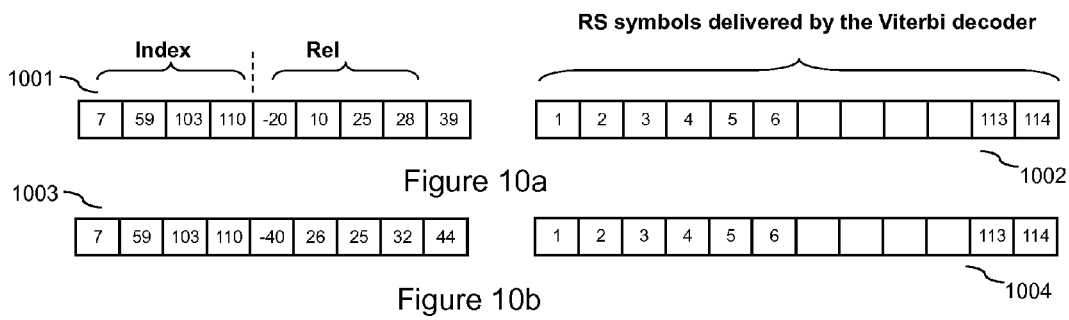
Figure 10a
Figure 10b
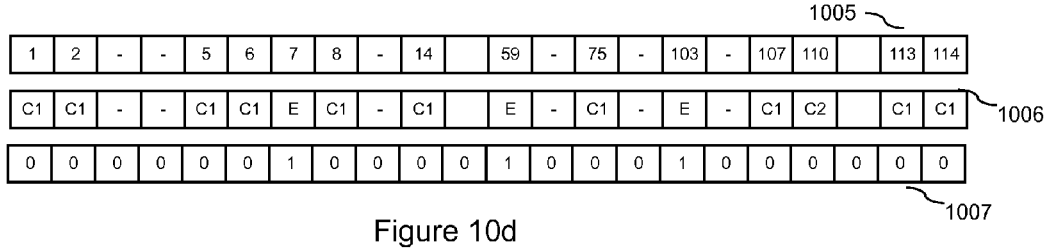
→ D7, 59, 103 marked as erased
D110 = D110 copy 2
Figure 10c
Figure 10d

US 8,423,877 B2

METHOD FOR DETERMINING A COPY TO BE DECODED AND AN ASSOCIATED ERASURES VECTOR, CORRESPONDING STORAGE MEANS AND RECEIVER DEVICE

1. FIELD OF THE DISCLOSURE

The field of the disclosure is that of communications networks. The disclosure can be applied especially but not exclusively in a wireless network.

More specifically, an embodiment of the invention pertains to the determining of a copy to be decoded and an associated erasures vector by a receiver device receiving, through a communications network, several copies of a same original piece of data encoded according to an error correction code.

2. TECHNOLOGICAL BACKGROUND

We shall strive more particularly here below in this document to describe a set of problems existing in the particular case of "mmWave WPAN (Millimeter Wave Wireless Personal Area Network) type wireless networks.

The disclosure naturally is not limited to this particular field of application but is of interest for any decoding technique that needs to cope with a proximate or similar set of problems.

The mmWave WPAN type networks mentioned here above are particularly well suited to applications that are heavy consumers of bandwidth, for example home audio-visual applications. Indeed, the 60 GHz radio band used by this type of network offers a substantial bandwidth, thus enabling the transportation of large quantities of data as is required for example for the transportation of video streams with 1080p resolution. However, frequencies in the range of 60 GHz have wavelengths in the range of one millimeter and are easily absorbed by obstacles (walls, furniture, living beings etc) because of the very low rate of reflection on obstacles and a very high rate of attenuation in air.

In a communications network, communications between a sender device (here below also called a source node) and a receiver device (also called a destination node here below) can be easily disturbed and data can be lost.

To resolve this problem, two approaches are commonly used. They consist in implementing either a temporal redundancy with transmission at different points in time or spatial redundancy through a use of several antennas and modules for processing a physical signal. These two approaches can be combined by use of a meshed network in which data relays are set up, according to a predefined clocking rate. The diversity of the relays provides spatial diversity and the controlled clocking (in the form of TDMA or Time Division Multiple Access type access) provides temporal diversity. In this type of network, the data transmitted by the source node can therefore flow on different paths. Several copies (there are therefore redundancies) of the same pieces of transmitted data can therefore be received by the destination node and thus facilitate the correction of errors in order to retrieve data originally sent out by the source node.

Spatial redundancy is facilitated by the small wavelength of the radio signals which enables the making of miniature antennas. It is then possible to envisage the installation of several antennas and modules (or blocks) for receiving signals for a same receiver device. Thus, the signals reach each of the antennas of the receiver device along different paths and the risks of having a concealment of the set of communications paths between the sender device and the multiple reception modules is greatly diminished. To increase the spatial diversity, it is appropriate to move the antennas away from each other (and therefore to move them away from a common data processing module). To limit the excess cost entailed by this duplication of reception modules, it is appropriate to limit the redundancy of the processing modules to those dedicated to processing of the physical signals corresponding to the layer 1 of the Open Systems Interconnection model (or OSI model).

These receiver devices must ensure the combination of the data transmitted by the different modules for processing physical signals so as to profitably use the information redundancy (flowing from the reception of several copies of a same piece of original data). Furthermore, it is necessary to minimize information exchanges between the modules (modules for processing physical signals and common data-processing module) which have been moved away to provide for spatial diversity. Indeed, in video type applications, the bit rate of the data to be processed is very high and it is not desirable to increase this bit rate greatly by adding information extracted from the modules for processing the physical signals.

In order to overcome data transmission errors inherent in the transmission channel, it is common practice to use error correction codes (or Forward Error Correction or FEC codes) in communications systems.

One of the error correction codes most commonly used in wireless networks is the Reed Solomon (RS) code. This code can be defined as they C(n, k) code where n represents the total number of symbols of the code word after encoding and k is a number of original data symbols (that are therefore n-k redundancy symbols).

In the Reed Solomon code, a symbol is a set of m bits. A value often used in hardware configurations is m=8.

The Reed Solomon code has a correction capacity of (n−k)/2 errors or (n−k) erasures, one erasure being an error in a symbol for which the position is known. More generally, the correction capacity C of such a code is defined as follows:

$$C = 2 \times \text{number of errors} + \text{number of erasures},$$

the upper limit of C being "d", the minimum distance of the code with d=(n−k)+1.

In order to reach the borderline correction capacity of a Reed Solomon decoder, it is necessary the mark the position of the erasures. Several methods are already well known for this purpose.

For example, one method applicable in the case of a system using multiple copies of a same code word (where the multiple copies result for example from a multiple reading or a multiple reception) is described in the U.S. Pat. No. 6,389,573. This document proposes to mark the positions of erasures by making a symbol-to-symbol comparison of the different copies of the same code word. The positions of erasures are marked at the places where the symbols are different from one copy to the other. For each position other than the positions of erasures, the copy to be decoded (to be transmitted to the decoder with the erasures vector) comprises the symbol which is identical in the different copies. The decoding capacity of this method is limited to the capacity of the decoder, despite the contribution of redundancy made by numerous copies of a same code word.

It must further be noted that most present-day data communications systems implement a combination of error correction systems by combining several error correction codes. One well-known example pertains to the use of a Reed Solomon type code and a convoluted code as illustrated in FIG. 1 (described in detail here below). Indeed, the concatenation of a block code processing symbols (sets of bits) and a convolutive type encoder processing bits gives a high error-correction capacity. At reception, the decoding of the data generated according to the convolutive code is conventionally done by a decoder based on the Viterbi algorithm.

The Viterbi algorithm selects, in a lattice diagram (a diagram representing possible transitions between the different states of the encoder) a maximum likelihood path (corresponding to the path possessing level of reliability that is the highest. This decoder is especially in A. J. Viterbi, "Error bounds for convolutional codes and an asymptotically optimum decoding algorithm", IEEE Trans. IT., Vol 13 (1967), pp. 260-269). For a brief reminder of convoluted codes and their decoding by the Viterbi algorithm, reference could also be made to J. K. Omura, "On the Viterbi Algorithm", IEEE Trans. IT., January 1979, pp. 177-179.

Several variance of the Viterbi algorithm have been proposed in order to have symbol-by-symbol information available on the reliability of the decoding done. Such variance have been proposed especially in the following publications:

G. Battail, "Weighting of the symbols decoded by the Viterbi algorithm, Ann. Télécomm., Vol. 42 (1987), No 1-2, pp. 31-38);

J. Hagenauer, P. Hoeher, "A Viterbi algorithm with soft-decision output and its applications", IEEE Globecom, Dallas, 1989, pp. 47.1.1-47.1.7).

R. Sfez, G. Battail, "A weighted output variant of the Viterbi algorithm for concatenated schemes with convolutional internal encoding, Eurocode 90, Udine, Italy;

Patent document EP0758167.

These algorithms are used to obtain information on reliability of the decoded piece of data and are more commonly known as algorithms of the SOVA (Soft Output Viterbi Algorithm) type.

In a transmission system implementing spatial and/or temporal redundancy of data, i.e. a system in which multiple copies of the same encoded piece of data are received in order to minimize the errors of transmission on the transmission channel (or facilitate its identification), the problem is to determine which are the symbols and the erasures vector to be transmitted to a decoder (for example of the Reed Solomon type) to have a minimum error rate at output of decoding.

This problem is particularly preoccupying in the case of a transmission of data where the data bit rates to be transmitted are very high (in the case for example of a transmission of high-definition digital video data) and where it is therefore impossible or penalizing to adding a great deal of additional information to the data in order to obtain the desired result at output of decoding, i.e. a bit error rate that is as low as possible.

Indeed, in this case, the databus connecting the different layers (i.e. the different modules) of the receiver device must convey a high bit rate of information (several Gbps) and it is not desirable to increase this bit rate greatly.

The US patent document 2007/0115801 describes:

A first method for selecting signals received by the multiple antennas (or reception systems) in order to improve the quality of reception of the signal. This first method is based on the use of a parameter representing the quality received on each sequence such as for example an RSSI (Received Signal Strength Indication) measurement or else again an SNR (signal-to-noise ratio) measurement.

a second method for combining FFT (Fast Fourier Transform) block output signals of each reception system. The second method is based on the MRC (Maximum Ratio Combining) method in which a linear combination is made of two antenna signals so as to obtain a resulting signal that maximizes the reception level before applying the demodulation.

The resulting signal coming from the MRC module is then demodulated and decoded by means of a turbodecoder.

This patent document describes a first method for selecting signals and a second method for combining signals which are situated upline from the demodulation. These methods are based on a level of power in reception to decide on the signal to be decoded; thus, the selection is made upstream from the decoder. However, a signal having a high level of power at reception is not necessarily the one that will ensure the best error rate at output of the decoder.

The U.S. Pat. No. 6,065,149 describes an error correction system used to perform a very precise decoding operation and obtain a low bit error rate. The internal decoder or inner decoder is a SOVA type. The system is based on the use of a CRC (Cyclic Redundancy Check) algorithm which gives information on reliability that is additional to the one given by the internal decoder. These two pieces of information are used to determine the erasures vector at input of the external decoder.

The U.S. Pat. No. 7,228,489 describes an encoding system that combines a Viterbi decoder and a Reed Solomon decoder so as to improve the performance of the error correction system. The internal decoder is of the SOVA type and the information on reliability that it gives is summated by a symbol so as to determine the reliability of the symbol. The symbols that are most probably erroneous are indicated in the erasures vector of the Reed Solomon decoder.

The U.S. Pat. Nos. 6,065,149 and 7,228,489 mentioned here above therefore each propose a particular implementation of a communications system combining two error correction codes (inner code and outer code) but none is located in the particular context where the communications system implements spatial redundancy and/or temporal redundancy (multi-copy system). It is all the more the case that neither of these two documents proposes a permanent solution, in this particular context, to the problem of minimizing the error rates at output of the outer decoding.

3. GOALS OF THE DISCLOSURE

At least one embodiment of the invention is aimed especially at overcoming these different drawbacks of the prior art.

More specifically, it is a goal of at least one embodiment of the invention to provide a technique making it possible, in a transmission system implementing spatial redundancy and/or temporal redundancy of the data, for a receiver device to have a minimum bit error rate at output of the decoder (first type decoder).

It is another goal of at least one embodiment of the invention to provide a technique of this kind which, when the decoder of a first type is used in combination with at least one decoder of the second type, provides information on reliability of the decoded symbols (according to the second type of decoding) to limit the volume of exchanges within the receiver device between a first processing block comprising the first decoder and a second processing block comprising one or more decoders of a second type.

It is another goal of at least one embodiment of the invention to provide a technique of this kind that is simple to implement and costs little.

4. SUMMARY

One particular embodiment of the invention proposes a method for determining a copy to be decoded and an associated erasures vector by means of a receiver device receiving at least two copies of a same piece of data encoded according to an error correction code, each received copy comprising several symbols, each associated with a position index in said copy, said copy to be decoded being designed to be decoded in taking account of the erasures vector by means of a decoder of a first type applying a decoding adapted to the error correction code.

This method is remarkable in that it comprises steps for:
obtaining, for at least one symbol of each copy received, a level of reliability of transmission associated with said symbol;
marking or not marking, for at least one given position index associated with a symbol included in said copy to be decoded, an erasure for said given position index in said erasures vector as a function of the reliability levels associated with the symbols which are positioned at said given position index in said received copies.

Thus, this particular embodiment of the invention relies on a wholly novel and inventive approach to determining the erasure svector associated with a data block to be decoded (which as described in detail here below is built out of the received copies) by using levels of reliability of transmission associated with symbols contained in different copies of a same block of received pieces of data.

Thus, an embodiment of the invention avoids having to make symbol/symbol comparisons on all the copies received to mark the positions of erasures, thus minimizing the operations to be performed to determine the erasures vector.

Furthermore, since it takes account of levels of transmission reliability, the marking of the erasures is optimized since there is an increase in the probability that only "true" erasures will be marked as such. This avoids the generating of an excessively large number of erasures (even when the transmission of certain received copies is unreliable) and therefore gives a number of erasures that does not exceed the correction capacity of the first decoder. Ultimately therefore, the error rate at output of the first decoder (for example a Reed Solomon type block decoder) is reduced.

Advantageously, this method comprises steps for:
obtaining, for each received copy, a set of a number N of position indices associated with N symbol(s) of said received copy for which the associated level or levels of reliability is/are the N lowest level or levels from amongst the levels of reliability of all the symbols of each copy received, with N being equal to or greater than 1;
for at least one given position index corresponding to a symbol included in said copy to be decoded, marking an erasure in said erasures vector if said given position index belongs to all the sets of N position indices obtained for all the received copies.

Thus, an erasure is marked for a given position index only if the reliability of the symbol placed at this index is low for all the copies. This criterion of decision is simple to implement and requires few computations.

Advantageously, the number N of position indices of each set is a function of a maximum information bit rate that can be accepted by an interface from:
a first processing block comprising a decoder of a second type generating said levels of reliability,
a second processing block including said first type of decoder.

Indeed, the greater the value of N, the better the decoding performance (i.e. with the lowest error rate) to the detriment however of a supplementary information bit rate (relative to the levels of reliability to be transmitted). Thus the decoding performance can be optimized as a function of the communications capacities between the processing blocks.

According to one advantageous characteristic, the method comprises steps which, for a symbol positioned at a given position index in said copy to be decoded, are steps for:
determining a set of remaining symbols such that, for each copy received, the symbol positioned at the given position index in said received copy belongs to said set if said given position index does not belong to the set of N position indices obtained for said received copy;
checking to see if there is a majority of remaining symbols possessing a same value;
in the event of a positive check, choosing said same value for said symbol positioned at said given position index in said copy to be decoded.

Indeed, since the probability of having the same errors on each of the copies is very low, the same value possessed by said majority of remaining symbols is deemed to be a reliable value.

According to an advantageous characteristic, the method comprises steps:
in the event of negative check:
for obtaining, for each copy received whose symbol positioned at said given position index is a remaining symbol, a level of overall reliability associated with said copy received;
for choosing, for each symbol positioned at said given position index in said copy to be decoded, the value of the remaining symbol which is included in the received copy associated with the greatest level of overall reliability obtained.

Thus, the probability of not introducing error into the copy to be decoded is increased through the selection of the copy having the best level of overall reliability.

According to one advantageous characteristic, said receiver device receiving said first and second copies, the method comprises steps which, for at least one given index position, corresponding to a symbol included in said copy to be decoded, are steps for:
selecting, for said position symbol positioned at said given position index in said copy to be decoded, the value of the symbol at said given position index in the second copy received if said given position index belongs to a first set of N position indices obtained for said first copy received;
selecting, for said symbol positioned at said given position index in said copy to be decoded, the value of the symbol at said given position index in the first copy received if said given position index belongs to a second set of N position indices obtained for said second copy received.

Thus, in the particular case of a reception of only two copies, the probability of not introducing error into the copies to be decoded is increased by selecting a symbol of a higher level of reliability.

According to another advantageous characteristic, the method comprises a step which, if said given position index belongs to no set amongst said first and second sets of N position indices, and if the symbols in the first and second copies received possess a same value, is a step for choosing said same value.

Thus, the probability of not introducing error into the copy to be decoded is increased by selecting a symbol for which the received copies are matched.

According to one advantageous characteristic, the method furthermore comprises steps which, if said given position index belongs to no set amongst said first and second sets of N position indices, are steps for:

obtaining, for each received copy whose symbol positioned at said given position index is a remaining symbol such that the given position index does not belong to the set of N position indices obtained for each received copy, a level of overall reliability associated with said received copy;

choosing, for said symbol positioned at said given position index in said copy to be decoded, the value of the remaining symbol which is included in the received copy associated with the greatest level of overall reliability obtained.

Thus, the probability of not introducing error into the copy to be decoded is increased by selecting the copy having the best level of overall reliability.

According to one advantageous characteristic, the method comprises steps for:

checking to see whether a total number of one or more erasures marked in said erasures vector is greater than a maximum predetermined number S;

and in the event of a positive verification:

re-setting the erasures vector in eliminating the pre-marked erasures;

building a list of position indices for which an erasure has been pre-marked in the erasures vector;

associating, with each position index of the list, the highest level of reliability amongst those associated with the symbols positioned at said position index in the received copies;

classifying the list by rising order of levels of reliability associated with the position indices;

marking an erasure for the S first position indices of the classified list;

choosing, for each other position index of the classified list not marked as an erasure, for the symbol positioned at said position index in said copy to be decoded, the value of the symbol for which the level of reliability is the highest amongst the levels of reliability of the symbols positioned at said position index in the received copies.

Thus, the probability of not introducing error into the copy to be decoded is increased by selecting the symbols having the best levels of reliability, and doing so in ensuring that the number of erasures determined for the copy to be decoded remains smaller than or equal to the maximum number of predetermined erasures S.

According to one advantageous characteristic, said predetermined maximum number S of erasures is smaller than or equal to a limit capacity of correction of said error correction code.

Thus, an embodiment of the invention avoids bringing the first decoder to the limit of its correction capacity, solely with the erasures. Indeed, since the value of the parameter S is adjustable, it is possible to keep a complementary margin of error for the correction of errors (other than the erasures) by the first decoder, and this therefore minimizes the error rate at output of the first decoder.

Advantageously, the decoder of the first type is a block decoder and the decoder or decoders of the second type i/are a convolutive decoder or convolutive decoders.

Thus, an embodiment of the invention can be applied especially when the decoding done by the first type of decoder is an outer decoding that is combined with an inner decoding performed by one or more decoders of a second type, this inner decoding providing information on reliability of the inner decoding of each symbol.

Another embodiment of the invention concerns a computer program product that comprises program code instructions for implementing the above-mentioned method (in any of its different embodiments) when said program is executed on a computer.

Another particular embodiment of the invention concerns a computer-readable storage means storing a computer program comprising a set of instructions executable by a computer for implementing the above-mentioned method (in any of its different embodiments).

Another embodiment of the invention concerns a receiver device adapted to determining a copy to be decoded and an associated erasures vector, said receiver device receiving at least two copies of a same piece of data encoded according to an error correction code, each received copy comprising several symbols, each associated with a position index in said copy, said copy to be decoded being designed to be decoded in taking account of the erasures vector by means of a decoder of a first type applying a decoding adapted to said error correction code.

Remarkably, the receiver device comprises:

means for obtaining, for at least one symbol of each copy received, a level of reliability of transmission associated with said symbol;

means for marking, for at least one given position index associated with a symbol included in said copy to be decoded, an erasure for said given position index in said erasures vector as a function of the reliability levels associated with the symbols which are positioned at said given position index in said received copies.

5. BRIEF DESCRIPTION OF THE DRAWINGS

Other features and advantages of embodiments of the invention shall appear from the following description, given by way of an indicative and non-restrictive example, and from the appended drawings, of which:

Figure 6:
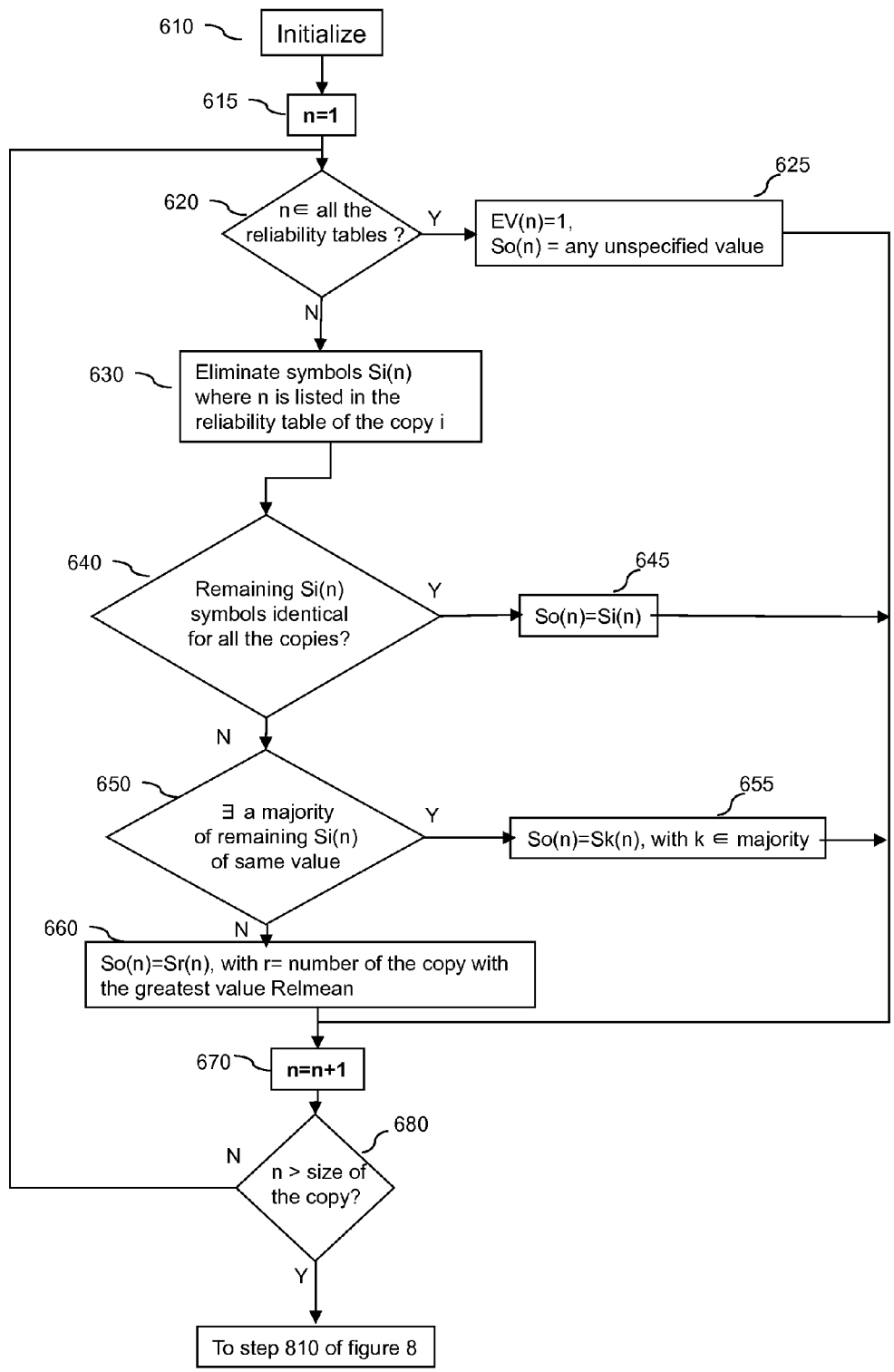
Figure 7:
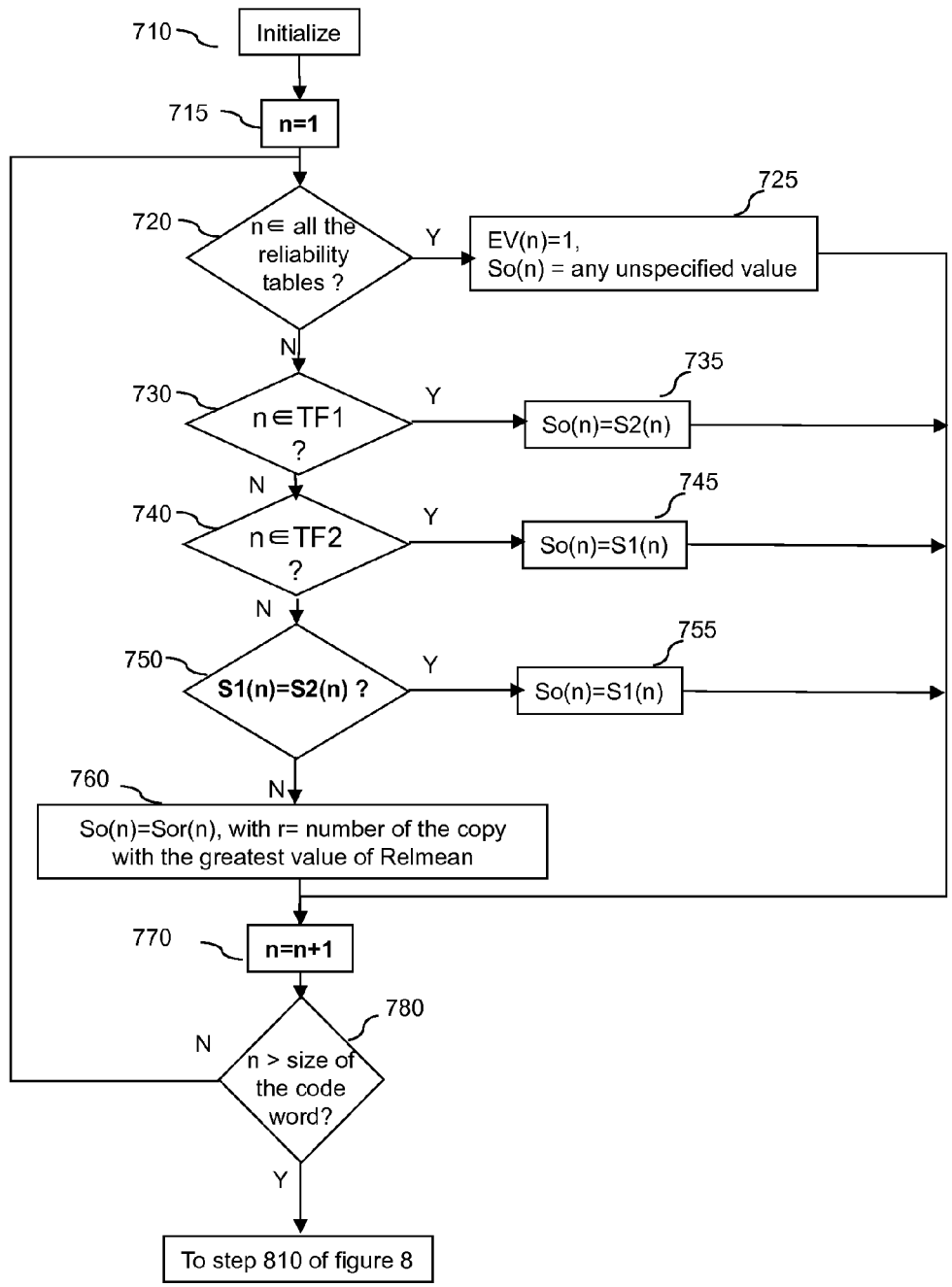
Figure 8:
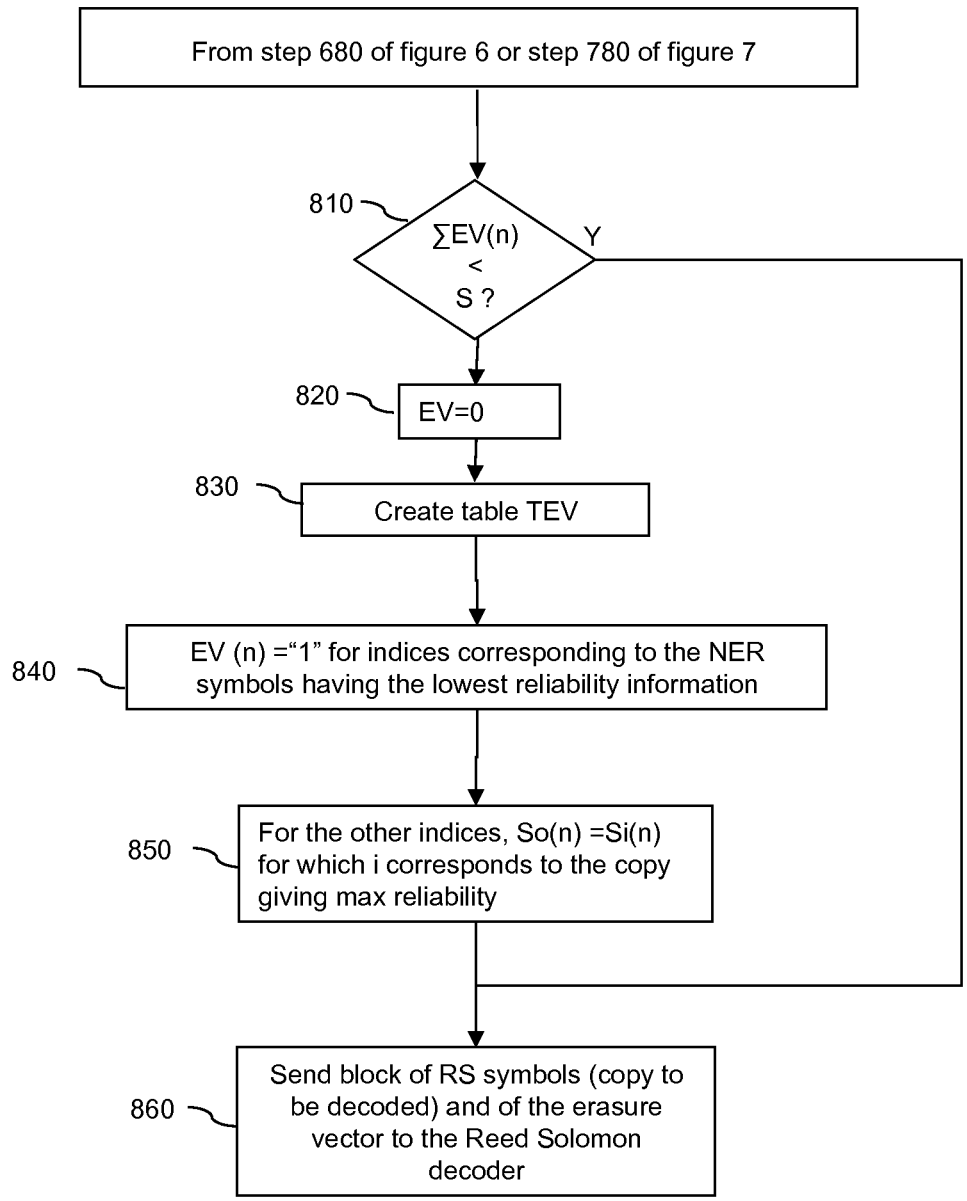

FIGS. 6 to 8 present a overall flowchart of one particular embodiment of the method according to the disclosure:

FIG. 6 is a first part of this overall flowchart in the general case where the number of copies received is greater than or equal to 2;

FIG. 7 is a variant of the above-mentioned first part in the particular case where the number of copies received is equal to 2;

FIG. 8 is a second part of this flowchart enabling especially management of the number of erasures;

FIGS. 9a, 9b and 9c illustrate an example of application of the overall flowchart of FIGS. 6 to 8 in the case of a two-copy system and when there is little correlation between the two copies;

FIGS. 10a, 10b, 10c and 10d illustrate an example of application of the overall flowchart of FIGS. 6 to 8 in the case of a two-copy system and when there is a great deal of correlation between the two copies.

6. DETAILED DESCRIPTION OF ILLUSTRATIVE EMBODIMENTS

Figure 1:
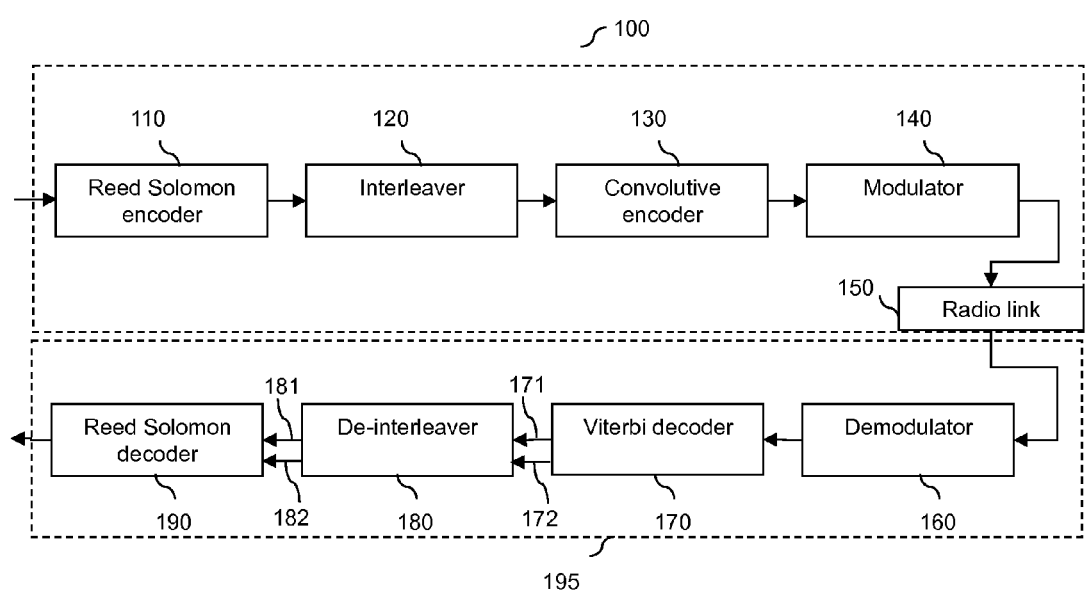
FIG. 1 is a schematic illustration of a known technique of concatenation (or combination) of error correction codes used for example in satellite communications systems.

FIG. 1 is a schematic illustration of a known technique for combining error correction codes used for example in satellite communications systems.

This technique implements a convolutive encoder (more generally also called an "inner encoder") and a block encoder (more generally also called an outer encoder) for example of the Reed Solomon type.

In a sender device 100, data to be transmitted (grouped together in m-bit symbols according to the Reed Solomon code chosen) are first of all provided to a Reed Solomon encoder 110 which adds redundancy data thereto.

Then, the pieces of data output from the Reed Solomon decoder 110 (i.e. the data to be transmitted and the redundancy data) are transmitted to an interleaver 120 which mixes these pieces of data together. The mixed data then passes into a convolutive encoder 130 which adds new redundancy data to them before transmitting them to a modulator 140. This modulator 140 then modulates the pieces of data output from the convolutive encoder 130 so as to be able to send them on a radio link 150 to a receiver device 195.

In the receiver device 195, the signals received through the radio link 150 are de-modulated by a demodulator 160 which then transfers data which may be vitiated by error to a Viterbi decoder 170. This decoder uses the redundancy data introduced by the convolutive encoder 130 to detect and correct possible errors.

At output of the Viterbi decoder 170, pieces of corrected data 171 are then transmitted to a de-interleaver 180 which carries out a mixing operation which is the reverse to the operation performed by the interleaver 120 of the sender device 110.

The pieces of data 181 coming from the de-interleaver 180 are then grouped together as Reed Solomon symbols and then applied to the input of a Reed Solomon decoder 190. This Reed Solomon decoder 190 uses the redundancy data introduced by the Reed Solomon encoder 110 of the sender device 100 to detect and correct possible residual errors.

If the Viterbi decoder 170 used implements a SOVA type decoding algorithm and if the decoding algorithm of the Reed Solomon decoder 190 makes it possible to take account of the information on reliability of the incoming data, then pieces of auxiliary data 172 representing a bit reliability (or likelihood) of the data decoded by the Viterbi decoder 170 are also de-interleaved by the de-interleaver 180. These pieces of auxiliary data are then converted into reliability information 182 of a Reed Solomon symbol type, and then transmitted to the Reed Solomon decoder 190. Each piece of reliability information has an associated level of reliability.

The conversion of the information on 'bit' reliability 172 coming from the Viterbi decoder 170 into information on "Reed Solomon symbol" reliability 182 is done through bit reliability information on the m bits of the symbol or by choosing the weakest bit reliability information (i.e. the information for which the associated level of reliability is the lowest) or again by using any other algorithm for converting reliability information known to those skilled in the art.

Figure 2:
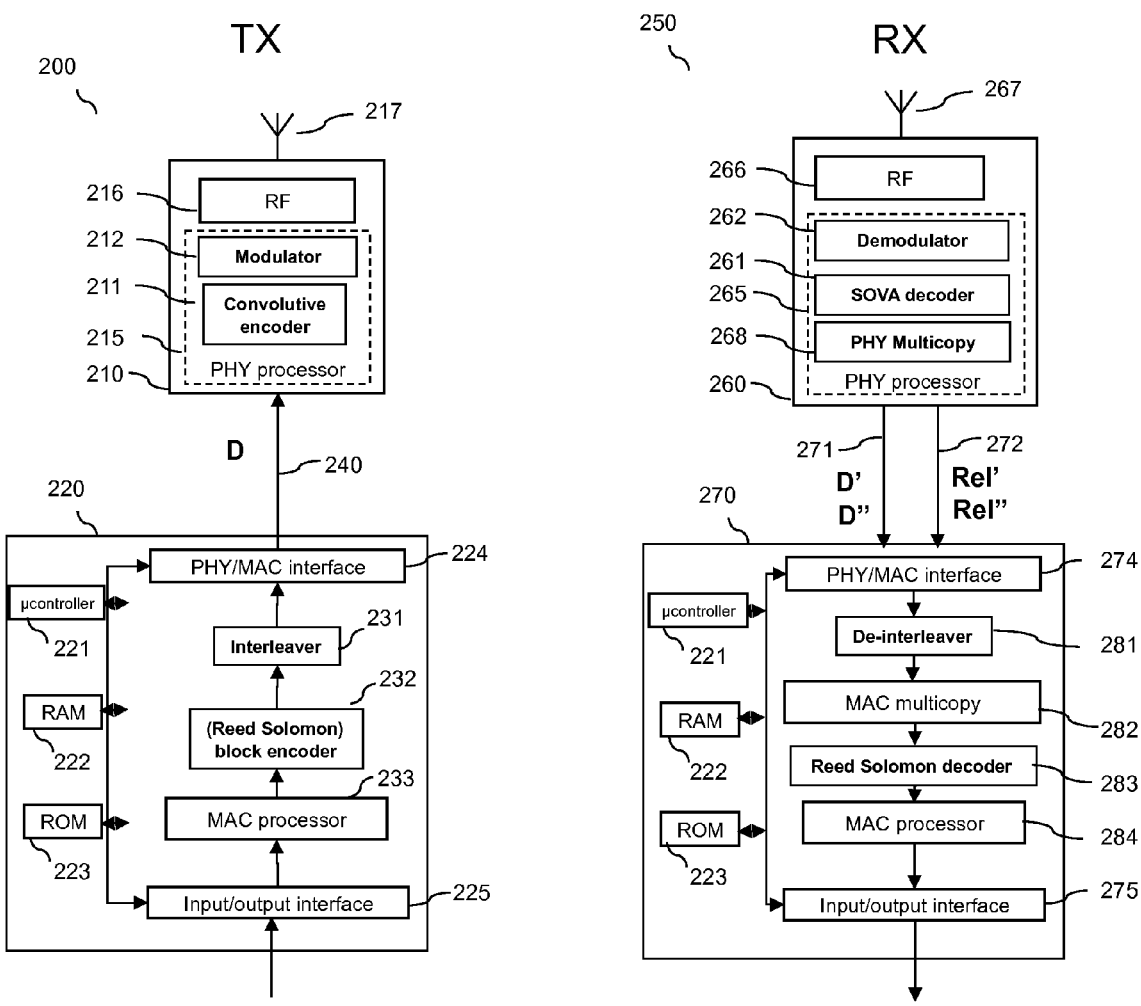
FIG. 2 is a schematic illustration of an architecture of a transmission system based on a temporal redundancy of data according to a first particular embodiment of the invention.

FIG. 2 is a schematic illustration of an architecture of a transmission system based on a temporal redundancy of the data according to a first particular embodiment of the invention.

Here below in the description, the term "module" is understood to mean a data processing block.

A sender block 200 consists of two main modules: a MAC TX module 220 and a PHY TX module 210.

The pieces of data to be transmitted are given by an application layer of the sender device 100 to an input/output interface block 225 of the MAC TX module 220, which then transmits them to a MAC processor module 233. The MAC processor module 233 performs all the operations for implementing a transmission medium access control protocol or MAC protocol.

The pieces of data are then transmitted to a Reed Solomon type block encoder 232 which, after the addition of redundancy data, transmits them to an interleaver 231. This interleaver 231 then mixes the encoded data by permutation of bits in order to improve the robustness relative to errors of the error correction system.

The pieces of data are then transferred to a PHY/MAC interface 224 which transmits them to the PHY TX module 210 by the link 240.

The PHY TX module 210 is in charge of performing operations to transfer data on the radio link as well as an encoding operation to minimize the bit error rate of the communication.

This PHY TX module 210 includes a PHY processor module 215 used to process data and convert into a baseband signal.

It also includes an RF radio module 216 which transposes this baseband signal into a radio signal and then transmits it to a sending antenna 217.

The PHY processor module 215 comprises chiefly a convolutive encoder module 211 which again adds redundancies to the data to be transmitted and a modulator 212 which converts the data into a signal transmittable by radio to a receiver device 250.

The receiver device 250 consists of two main modules: a MAC RX module 270 and a PHY RX module 260.

The radio signal coming from the sender device 200 is received by an antenna 267 of the receiver device 250 and then processed in the PHY RX module 260. This processing is done by an RF radio module 266 which transposes it into a baseband signal that is then transmitted to a PHY processor module 265.

This PHY processor module 265 comprises chiefly a demodulator module 262 which converts the baseband signal into data and a SOVA type Viterbi decoder 261 which makes a first error correction by using the pieces of redundancy information introduced by the convolutive encoder 211 of the sender device 200.

The Viterbi decoder 261 provides pieces of corrected data with, for each of them, a piece of information on reliability. These pieces of corrected data are provided to a multi-copy module PKY 268 which applies an algorithm for preparing a reliability table described in greater detail here below with reference to FIG. 4. This algorithm is used chiefly to adapt the data stream coming from the Viterbi decoder 261 to the capacity of the communications link 271, 272 between the PHY RX module 260 and the MAC RX module 270, this link providing for the transport of the pieces of corrected data and of the associated reliability tables. The PHY RX module 260 therefore gives the MAC RX module 270, for each copy received, all the pieces of decoded data accompanied by a certain number of pieces of information on reliability.

Should the redundancy of the data be of a temporal type (with successive reception of several copies of the same piece of data), the PHY RX module 260 will successively give the MAC RX module 270, for example in the case of two successive receptions, corrected pieces of data D' accompanied by reliability tables Rel', and then corrected pieces of data D" accompanied by reliability tables Rel". The corrected pieces of data D' and D" are transmitted on a communications link 271 and the reliability tables Rel' and Rel" are transmitted on the communications link 272.

The communications link 271 and 272 as well as the communications link 240 may consist of a communications interface, of a serial type for example, enabling the PHY RX module 260 or PHY TX module 210 to be removed to a distance by means of a cable. These communications links, in another embodiment, may consist of on-board communications interfaces, of a parallel type for example. These links can furthermore be shared with inter-module communications other than those described here below, thus limiting the available bandwidth available on these communications links for communications between the sender device 200 and the receiver device 250.

The pieces of data and information are received in the MAC RX module 270 by a PHY/MAC input/output interface block 274 which takes charge of communication between the MAC RX module 270 and the PHY RX module 260. Once the pieces of data are put back in a format enabling the processing in the MAC RX module 270, these pieces of data are transmitted to a de-interleaver 281 which performs the operation in reverse to the one performed at sending by the interleaver 231. It must be noted that the de-interleaver module 281 also de-interleaves the information on the reliability table accompanying the data coming from the Viterbi decoder 261.

The pieces of data and information are then transmitted to a MAC multicopy module 282 which executes an algorithm to determine the Reed Solomon symbols (forming a copy to be decoded) and an associated erasures vector, to be transmitted to a Reed Solomon decoder 283. This algorithm is described in greater detail here below with reference to FIGS. 6 to 8.

The Reed Solomon decoder 283 then extracts errors if any from the data to be recovered and corrected by using the properties of the Reed Solomon code chosen. Then, it transmits them to a MAC processor 284 to carry out all the operations of implementation of the MAC protocol used in the system. The pieces of data coming from the MAC protocol 280 are then transmitted to the applications layer of the receiver device 250.

Preferably, the MAC TX processor module 220 and MAC RX processor module 270 also integrate a random-access memory (RAM) 222, which functions like a main memory and a computing unit 221 (or CPU i.e. Central Processor Unit). The capacity of this random-access memory 222 can be extended by an optional random-access memory connected to an expansion port not shown in FIG. 2. The CPU 221 is capable of executing an instruction when the communications device is powered on (sender device 200 or receiver device 250) on the basis of a read-only memory 223 (or ROM). After the CPU unit 221 has been powered on, it is capable of executing the instructions of the RAM 222 pertaining to a computer program once these instructions are loaded from the ROM 223 or an external memory (not illustrated in FIG. 2). Such a computer program, if executed by the CPU unit 221, prompts a part or all of the steps of the algorithm described here below with reference to FIGS. 4 and 6 to 8.

It is important to note that the present disclosure does not necessitate any particular processing of the data in the sender 200 and that neither the SOVA type Viterbi decoder 261 nor the Reed Solomon decoder 283 of the receiver device 250 are modified for its implementation.

In one particular embodiment of the invention, a copy comprises a Reed Solomon code word. In a first variant, each couple contains only a part of a code word and, in this case, it is necessary to reconstitute the code word from different copies before applying the algorithms of FIGS. 6 to 8. In a second variant, a copy comprises several code words. In this case, the algorithm of FIGS. 6 to 8 must be applied successively to the data constituting each code word.

Figure 3:
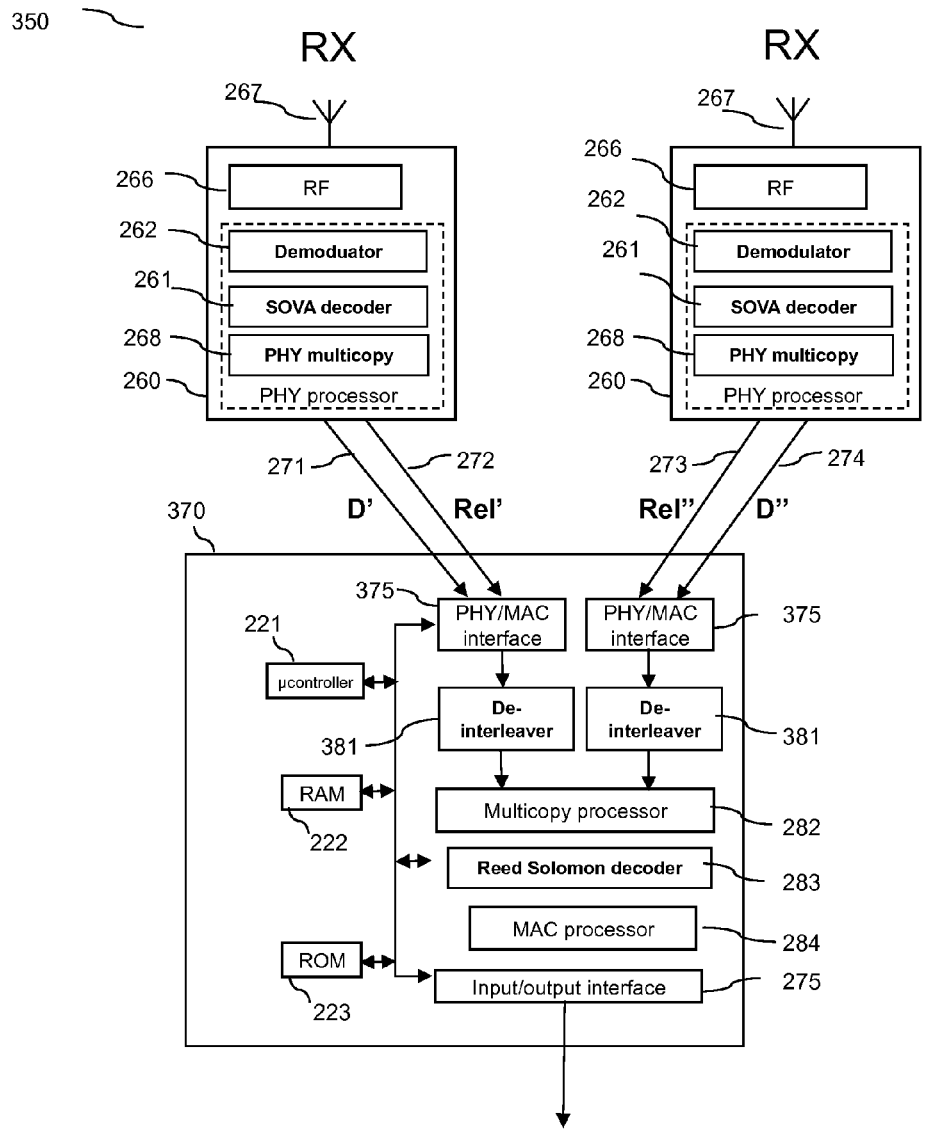
FIG. 3 is a schematic illustration of an architecture of a transmission system based on a spatial redundancy of data according to a second particular embodiment of the invention.

FIG. 3 provides a schematic illustration of an architecture of a transmission system based on a spatial redundancy of the data according to a second particular embodiment of the invention.

The architecture of the sender device 200 is unchanged and shall therefore not be described in detail again.

FIG. 3 illustrates the case of a receiver device 350 comprising two PHY modules RX 260 that are identical to those described in FIG. 2 and one MAC RX module 370.

Each PHY RX module 260 has an antenna 267 for receiving data coming from the sender device 200. Each PHY RX module 260 gives the MAC RX module 270 pieces of corrected data and reliability tables coming from the radio signal received by its antenna.

In the example of FIG. 3, corrected pieces of data D' accompanied by reliability tables Rel' are (to the left of FIG. 3) on the links 271 and 272 linking the first PHY RX module 260 and the MAC RX module 370.

Again, the corrected pieces of data D" accompanied by reliability tables Rel" are transmitted on links 273 and 274 connecting the second PHY RX module 260 (to the right in the FIG. 3) and the MAC RX module 370.

The pieces of data and information are received in the MAC RX module 37 by two instantiations of a PHY/MAC input/output interface block 375 which takes responsibility for the communication between the MAC RX module 370 and the two PHY modules RX 260. Once the data has been put into a format enabling processing in the MAC RX module 370, these pieces of data are transmitted to two de-interleavers 381 which carry out an operation in reverse to the one performed when sending by the interleaver 231; these de-interleavers 381 also de-interlace the information on reliability that accompany the pieces of data coming from the SOVA type Viterbi decoders.

The difference in the implementation of the disclosure in one architecture of a transmission system based on a temporal redundancy (the case of FIG. 2) and the implementation in an architecture of a transmission system based on a spatial redundancy with two physical modules (the case of FIG. 3) is therefore limited to the duplicating of the PHY RX module 260, the PHY/MAC interface module 375 and the de-interleaver 381.

The algorithms implemented in the PHY multicopy modules 268 and the MAC multicopy modules 282 and 382 are identical for both types of redundancy.

Figures 4, 5:
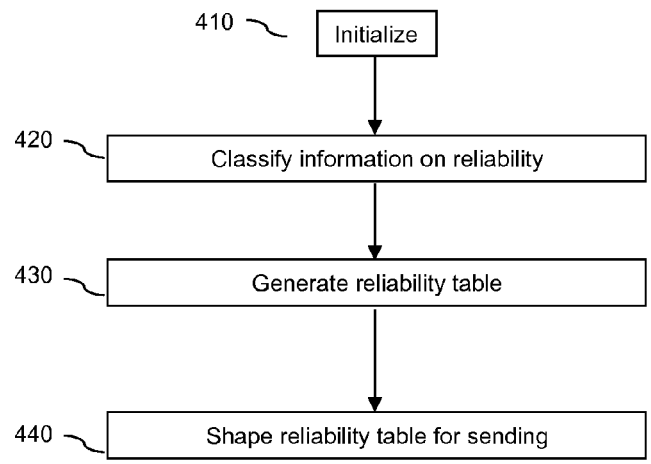
FIG. 4 is a flowchart of an algorithm for generating a reliability table implemented in a module for receiving physical signals included in the receiver device of FIG. 2 or FIG. 3, according to a particular embodiment of the invention.
FIG. 5 is an example of a reliability table generated by application of the flowchart of FIG. 4.

FIG. 4 illustrates a flowchart of an algorithm for generating a reliability table implemented in a PHY RX module included in the receiver device of FIG. 2 or 3, according to one particular embodiment of the invention.

This algorithm is implemented in each multicopy module PHY 268 of the receiver device 250 and 350 and enables the creation of the reliability tables intended for the MAC multicopy module 282 and 382 integrated into the MAC RX module 270 and 370.

Let us take a parameter S corresponding to a predetermined maximum number of erasures desired. This number is for example defined by the user. Its value may take at most the value "n−k" for a Reed Solomon code C(n,k).

This value of the parameter S can also be smaller than this maximum value so as to leave an error correction margin for the decoder.

For example, for a Reed Solomon code C(114, 96), the correction capacity of this code is 18 (114−96=18). Hence, the maximum value for the parameter S is 18. For example, S is taken to be equal to 10.

In a first step 410, the PHY multicopy module 268 gets reset and loads the parameter S, the set of data coming from the Viterbi decoder 261 as well as the information on reliability pertaining to this data.

In a following step 420, an intermediate table is created by determining, on the basis of "bit" reliability information given by the Viterbi decoder 261, the information on reliability of the "Reed Solomon symbols". These pieces of information on reliability are then classified in rising order of their level of reliability (it may be recalled that each piece of information on reliability is associated with a level of reliability).

In a following step 430, the reliability table 500 (FIG. 5) is created out of the intermediate table as follows.

First of all, the indices are determined for a number N of symbols for which the reliability levels are the lowest, and therefore correspond to the position indices situated at the head of the intermediate table. Then, these indices are inserted into the start of the reliability table.

The number N corresponds to the number of pieces of reliability information transmitted by the PHY RX module 260 to the MAC RX module 270 or 370. This number N depends on the rate of information that the communications link 272 or 273 can support.

The greater the value of N, the higher the performance levels of decoding of the system, but the costlier it is in terms of setting up the hardware part (including the necessary bit rate between the modules).

The maximum value of N corresponds to the number of symbols contained in the copy. In such a case, this amounts to doubling the bit rate of data to be transmitted between the PHY RX module 260 and the MAC RX module 270 or 370. This is not desirable for high-bit-rate applications.

Then, on the N following positions of the reliability table, levels of reliability are inserted corresponding to the indices inserted at the N first positions of the reliability table.

Then, at the end of the reliability table, a level of overall reliability is inserted, this overall level being for example the mean value ("Relmean") of the reliability levels of the symbols included in the data block (i.e. the copy) coming from the Viterbi decoder 261.

In a following step 440, the reliability table formed by 2*N+1 values is converted into a signal to be transmitted to the MAC RX module 270 and 370 on the communications link 272 or 273. The nature of the conversion depends on the chosen technology of data transfer between the PHY RX module 260 and the MAC RX module 270 or 370, for example a serialization or else again the application of a particular protocol. The technology of transfer chosen is a function of the performance values desired and of the hardware constraints.

We shall now provide the detailed example of the computation of an additional rate of information to be transmitted to the MAC RX module 270 or 370 to implement an embodiment of the invention.

For a system implementing a Reed Solomon code C(114, 96) with Reed Solomon symbols encoded on eight bits, a value of N parametrized at 4, an index encoded on seven bits and a reliability value encoded on eight bits, the number of bits to be transmitted is 114*8=912 bits. The reliability table has 4*(7+8)+8=68 bits. This gives an additional rate of information to be transmitted of 7%, this rate corresponding to the ratio of the 68 bits of the reliability table on the 912 bits corresponding to the data stream to be transmitted.

It can thus be seen that, in this example, the amount of data added to obtain an embodiment of the invention is small as compared with the number of pieces of data to be transmitted.

FIG. 5 presents an example of a reliability table generated by application of the flowchart of FIG. 4.

The first four values (Ind1 to Ind4) of the reliability table (with N=4) correspond to the position indices of the symbols having the lowest levels of reliability (Ind1 being the index corresponding to the least reliable piece of data, i.e. the lowest level of reliability) among the levels of reliability of all the symbols of the associated copy.

The four values Re11 to Re14 correspond to the levels of reliability of the four corresponding symbols (i.e. the symbols for which the position indices are Ind1 to Ind4).

The last value "Relmean" of the table corresponds to the overall level of reliability (mean value computed on all the levels of reliability of the symbols of the associated copy).

FIG. 6 presents a first part of this overall flowchart in the general case where the number of received copies is greater than or equal to two.

It must be noted that the flowchart of FIG. 6 is the same whatever the origin of the multicopies (i.e. whether it pertains to a temporal redundancy or to a spatial redundancy).

Let m be the number of received copies, n the index of the symbols within each copy and i the index of the copies (1<i<m).

In the initializing step 610, the m copies as well as the m associated reliability tables are received from the m PHY modules RX 260. The values of an erasures vector EV(n) for each index n are also set at zero in this step 610.

In a step 615, the index n is set at the value 1.

In a following step 620, a check is made to see if this index n is listed in all the received reliability tables.

If the result of the test of the step 620 is positive, it means that the level of reliability of the corresponding symbol is low on all the copies. This symbol is then considered to be erased. In a step 625, an erasure is marked for this position index n. To this end, the element EV(n) of the erasures vector of this index n is then set at a value "1" informing the Reed Solomon decoder that this symbol is erroneous. The value of the symbol to be decoded So(n) for this index n can be set at any value since it will not be used by the decoder.

If the result of the test of the step 620 is negative then, in a step 630, the symbols Si(n) for which the index is listed in the reliability table of the copy i are eliminated. This operation therefore eliminates the symbols which have been detected as being among those least reliable by the Viterbi decoder.

In a following step 640, the integrity of the remaining symbols (i.e. the non-eliminated symbols) is checked by ascertaining that these symbols indexed n have the same value.

If the result of the test performed in the step 640 is positive, the probability of having the same errors in each of the copies being very low, it is deemed to be the case that the received value is good and that the symbols are therefore reliable. The erasures vector EV(n) remains zero for this index n and, in a step 645, the symbol to be decoded So(n) for this index n is assigned the value of the symbol Si(n).

It must be noted that the steps 640 and 645 are not indispensable for the proper running of the algorithm of FIG. 6, given the following steps in which checks are made to see if a majority of the remaining symbols possesses a same value of symbols.

If the result of the test performed in the step 640 is negative, it means that one or more of the remaining symbols has been corrupted during transmission although the computed reliability index indicates that the value of the symbols is reliable.

In this case, a check is made in a step 650 to see if a majority of the symbols Si(n) remaining among the j (1<j≦i) symbols chosen in the step 630 have the same value.

If the result of the test of the step 650 is positive, then a value Sk(n) received in a majority k of the copies is considered to be the right one. In a step 655, this value Sk(n) is then assigned to the symbol to be decoded So(n) for this index n.

If the result of the test of the step 650 is negative, i.e. if there are as many symbols Si(n) having different values, then the value transmitted by the copy r having the highest overall reliability value "Relmean" is chosen.

In the step 660, the symbol to be decoded So(n) is then assigned the value of the symbol Sr(n) of the copy r.

At output of the steps 625, 645, 655 and 660, the value of the symbol So(n) has been assigned whatever the values of the copies. The levels of reliability of the symbols as well as the erasures vector EV(n) have been possibly updated.

In a step 670, the operation passes to the next position index by incrementing the value by n.

In a following step 680, a check is made to see if the end of the copy has been reached.

If the result of the test of the step 680 is negative, the step 620 is again executed to process the next symbol.

If not, the operation passes to the second part of the overall algorithm described here below with reference to FIG. 8, used especially to manage the number of erasures.

FIG. 7 presents a variant of the above-mentioned first part in the particular case where the number of copies received is equal to two.

It must be noted that the flowchart of FIG. 7 is the same whatever the origin of the multicopies, i.e. that this is a temporal redundancy or a spatial redundancy.

In an initialization step 710, the two copies as well as the two associated reliability tables coming from the two PHY modules RX 260 are received. This step sets the values of the erasures vector EV(n) at zero for each index n.

In a step 715, the index n is set at the value 1.

In a following step 720, a check is made to see if this index n is listed in the two reliability tables.

If the result of the test of the step 720 is positive, it means that the level of reliability of the corresponding symbol is low on both copies. This symbol is then considered to erased.

In a step 725, an erasure is marked for this position index n. To this end, the element EV(n) of the erasures vector of this index n is then set at a value "1" informing the Reed Solomon decoder that this symbol is erroneous. The value of the symbol to be decoded So(n) for this index n can be set at any unspecified value because it will not be used by the decoder.

If the result of the test of the step 720 is negative, then in a step 730 a check is made to see if the index n is listed in the reliability table of the first copy named TF1.

If the result of the step 730 is positive, the index n being not listed in all the tables, it means that in principle the symbol of the second copy is reliable.

In a step 735, the value S2(n) is then assigned to the symbol to be decoded So(n) for this index n.

If the result of the step 730 is negative then, in a step 740, a check is made to see if the index n is listed in the reliability table of the second copy, named TF2.

If the result of the step 740 is positive and since the index n is not listed in the reliability table of the first copy TF1, it means that in principle the symbol of the first copy is reliable.

In a step 745, the value S1(n) is then assigned to the symbol to be decoded So(n) for this index n.

If the result of the step 740 is negative (i.e. if the index n is not listed in any of the two reliability tables), then in a step 750 a check is made to test the integrity of the symbols S1(n) and S2(n) in checking to see if these symbols indexed n have the same value.

If the result of the test performed in the step 750 is positive, the probability of having the same errors on each of the copies being very low, the received value is considered to be the right value. These symbols are therefore reliable and their value can be transmitted to the Reed Solomon decoder in a step 755. The erasures vector remains zero for this index.

If the result of the test performed in the step 750 is negative, it means that one or both symbols has (have) been corrupted during transmission, even though the reliability index or indices computed indicate that the value or values of the symbol or symbols is/are reliable.

In this case, in a step 760, the value transmitted by the copy r which will have the highest overall value of "Relmean" will be chosen. The symbol to be decoded So(n) is then assigned the value of the symbol Sr(n).

It must be noted that the step 760 can also be performed directly after the executions of the steps 720 to 740 without performing the test of the step 750. In this case, for each received copy whose given position index symbol n is a symbol, called a remaining symbol, such that the given position index n is not listed in the reliability table of the first copy or in the reliability table of the second copy, the step 760 comprises two operations. Firstly, it is a step for obtaining a overall reliable level "Relmean" associated with said received copy. Secondly it is a step for choosing, for said symbol to be decoded (So(n)) having a given position index (n) in said copy to be decoded, the value of the remaining symbol included in the received copy associated with the greatest level of overall reliability obtained.

It is important to note that, in this case, the risk of a wrong choice of symbol is notnil. In this particular embodiment of the invention, it is then advantageous not to choose the maximum value for the parameter S and to thus keep an error correction capacity in the Reed Solomon decoder. In other words, a value of S smaller than the correction capacity C of the Reed Solomon decoder is chosen.

At the exit from the steps 725, 735, 745, 755 and 760, the value of the symbol So(n) that has been assigned whatever the values of the copies and the reliability of the symbols, the erasures vector EV(n) having been possibly updated, the next position index is tested by incrementing the value of n in a step 770.

In a following step 780, a check is made to see if the end of the copy has not been reached.

If the result of the test of the step 780 is negative, the step 720 is again executed to process the following symbol.

If not, the operation passes to the second part of the overall algorithm described here below with reference to FIG. 8, enabling management of the number of erasures.

The number of erasures determined by the first part of the overall flowchart presented in FIG. 6 or FIG. 7 can be greater than the desired number of erasures S, which is very detrimental when the parameter is S is fixed at its maximum value (n−k). Indeed, the Reed Solomon decoder in this case gives wrong data. The second part of the total flowchart illustrated in FIG. 8 proposes a solution to this problem.

FIG. 8 shows a second part of the overall flowchart making it possible especially to manage the number of erasures.

A step 810 is used to compute the determined number of erasures determined by the first part of the overall flowchart of FIG. 6 or 7, in taking, for example, the sum of the elements of the erasures vector EV (the indices of the symbols considered to be erased are at one and the others at zero).

Then, in this same step 810, a check is made to see if this number of erasures is smaller than the predetermined maximum number of erasures S.

If the result of the test of the step 810 is positive, the erasures vector is considered to be valid and the operation passes directly to the step 860 in which the copy to be decoded (the symbol block) and the erasures vector as determined by the algorithm of FIG. 6 or 7 are transmitted to the Reed Solomon decoder.

If the result of the test of the step 810 is negative, the erasures vector and the copy to be decoded (symbol block) are re-defined in the steps 820 to 850.

In a step 820, all the elements of the erasures vector are reset at zero.

In a step 830, a work table TEV (refer to FIG. 10 for example) formed by the index of low reliability symbols common to all the reliability tables is created, these indices corresponding to a positive test during the step 620 (FIG. 6) or 720 (FIG. 7). In the work table TEV, each of these indices has, associated with it, the highest level of reliability among all the reliability levels associated with this index in all the reliability tables.

Then, these indices are classified by rising values of reliability levels.

In a step 840, then the S values of the elements of the erasures vectors which are the S first indices of the table are positioned at the value "1". The symbols which are these S indices will be considered to be erased and their value therefore has no importance.

In a step 850, the values So(n) for which the index n is not part of the S indices referred to here above receive the value Si(n) possessing the best reliability level.

All the elements of the erasures vector and symbols of the copy to be decoded (symbol block) having been determined, these pieces of data are then sent to the Reed Solomon decoder in a step 860.

FIGS. 9a to 9c illustrate an example of application of the overall flowchart of FIGS. 6 to 8 in the case of a system with two copies, and when there is little correlation between the two copies.

In this case, the errors due to the transmission of each copy do not affect the same symbols and the number of erasures created remains below the number S of erasures desired.

In this example, the value of the parameter S is fixed at 3 and the number of pieces of reliability information transmitted by the PHY RX module 260 to the MAC RX module 270 or 370 is fixed at 4. It is also assumed that there are no errors in the symbols not listed in the reliability table.

FIG. 9a provides a schematic illustration of an example of a reliability table 901 received for the first copy 902. Among the 114 symbols that form the first copy, the symbols 7, 59, 103, 110 respectively have reliability levels –20, 10, 25, 28. The level of overall reliability of the set of symbols of the first copy is 39.

FIG. 9b is a schematic illustration of an example of a reliability table 903 received for the second copy 904. Among the 114 symbols that form the second copy, the symbols 14, 75, 103, 107 respectively have reliability levels of –40, 26, 25, 32. The level of overall reliability of the set of symbols of the second copy is 44.

FIG. 9c is a schematic illustration of the result of the application of the overall algorithm of FIGS. 7 and 8.

The first row 905 gives the index of the symbols in the copy. The second row 906 gives the source (C1 for the first copy and C2 for the second copy) of the symbols forming the copy to be decoded, i.e. the copy to be sent to the decoder. For the symbols 14, 75 and 107, the symbols are those coming from the first copy. For the symbols 7, 59 and 110, the symbols are those coming from the second copy. Since all the other symbols have the same value, any one of the two copies can be selected. The value of the symbol 103, denoted E, has no importance since it has been declared to be efficient (in the presence of an erasure).

The third row 907 gives the contents of the erasures vector. Only the index element 103 is at one since this is a symbol of low reliability on both copies. The other elements remain at zero. There is therefore only one erasure declared to the decoder.

FIGS. 10a to 10d illustrate the example of application of the overall flowchart of FIGS. 6 to 8 in the case of a system with two copies and when there is much correlation between the two copies.

In this case, the errors due to transmission of each copy affect the same symbols and the number of created erasures between two should therefore be limited so as not to exceed the desired number of erasures S.

In this example, the parameter S is fixed at 3 and the number of pieces of information on reliability transmitted by the PHY RX module 260 and to the MAC RX module 270 or 370 is set at 4.

The assumption is also made wherein there is no error in the symbols not listed in the table of reliability.

FIG. 10a is table of reliability 1001 received for the first copy. Among the 114 symbols which form the first copy, the symbols 7, 59, 103, 110 respectively have levels of reliability of –20, 10, 25, 28. The level of overall reliability of the set of symbols of the first copy is 39.

FIG. 10b is table of reliability 1003 received for the second copy. Among the 114 symbols which form the second copy, the symbols 7, 59, 103, 110 respectively have levels of reliability of –40, 26, 25, 32. The level of overall reliability of the set of symbols of the second copy is 44.

FIG. 10c illustrates an example, on the basis of FIGS. 10a and 10b, of a table TEV 1008 created in the step 830 of the flowchart of FIG. 8. After classification in a rising order of levels of reliability, the first four elements of this table TEV are the indices of the least reliable symbols on the two copies. The following four elements are, for each index, the best values of reliability amongst the two received. The maximum number of erasures desired being set at 3, only the symbols corresponding to the first three indices of the table TEV (7, 103, 59) are considered to be erased (hence the element corresponding to this index is set at 1 in the erasures vector). For the fourth index 110 listed in this table, the symbol transmitted to the decoder is the most reliable of the two received. In this example, this is the symbol coming from the second copy.

FIG. 10d illustrates the final result of the application of the overall algorithm of FIGS. 7 and 8.

The first row 1005 gives the index of the symbols in the copy. The second row 1006 gives the source of the symbols which constitute the copy to be decoded (i.e. the copy to be sent to the decoder). For the index 110, the symbol is the one coming from the second copy. For the indices 7, 59, 103, the value E has little importance since these symbols are declared to be erased. Since all the other symbols have the same value, any unspecified one of the two copies is selected.

The third row 1007 gives the content of the erasures vector. The indices of 78, 59, 103 are at 1, while the others remain at 0. There are therefore three erasures declared to the decoder.

The invention claimed is:

1. Method for determining a copy to be decoded and an associated erasures vector by means of a receiver device receiving at least two copies of a same piece of data encoded according to an error correction code, each received copy comprising several symbols, each associated with a position index in said copy, said copy to be decoded being designed to be decoded in taking account of the erasures vector by means of a decoder of a first type applying a decoding adapted to the error correction code, said method wherein it comprises steps for:
 obtaining, for at least one symbol of each copy received, a level of reliability of transmission associated with said symbol;
 marking or not marking, for at least one given position index associated with a symbol included in said copy to be decoded, an erasure for said given position index in said erasures vector as a function of the reliability levels associated with the symbols which are positioned at said given position index in said received copies.

2. Method according to claim 1, wherein it comprises steps for:
 obtaining, for each received copy, a set of a number N of position indices associated with N symbol(s) of said received copy for which the associated level or levels of reliability is/are the N lowest level or levels from amongst the levels of reliability of all the symbols of each copy received, with N being equal to or greater than 1;
 marking, for at least one given position index corresponding to a symbol included in said copy to be decoded, an erasure in said erasures vector if said given position index belongs to all the sets of N position indices obtained for all the received copies.

3. Method according to claim 2, wherein the number N of position indices of each set is a function of a maximum information bit rate that can be accepted by an interface from:
 a first processing block comprising a decoder of a second type generating said levels of reliability,
 a second processing block including said first type of decoder.

4. Method according to claim 2, wherein it comprises steps which, for a symbol positioned at a given position index in said copy to be decoded, are steps for:
 determining a set of a remaining symbol or symbols such that, for each copy received, the symbol positioned at the given position index in said received copy belongs to said set if said given position index does not belong to the set of N position indices obtained for said received copy;
 checking to see if there is a majority of remaining symbols possessing a same value;
 in the event of a positive check, choosing said same value for said symbol positioned at said given position index in said copy to be decoded.

5. Method according to claim 4, wherein it comprises steps:
 in the event of negative check:
  for obtaining, for each copy received whose symbol positioned at said given position index is a remaining symbol, a level of overall reliability associated with said copy received;
  for choosing, for each symbol positioned at said given position index in said copy to be decoded, the value of the remaining symbol which is included in the received copy associated with the greatest level of overall reliability obtained.

6. Method according to claim 2, said receiver device receiving said first and second copies, wherein it comprises steps which, for at least one given index position, corresponding to a symbol included in said copy to be decoded, are steps for: fiabilité globale
 selecting, for said symbol positioned at said given position index in said copy to be decoded, the value of the symbol at said given position index in the second copy received if said given position index belongs to a first set of N position indices obtained for said first copy received;
 selecting, for said symbol positioned at said given position index in said copy to be decoded, the value of the symbol at said given position index in the first copy received if said given position index belongs to a second set of N position indices obtained for said second copy received.

7. Method according to claim 6, wherein it comprises a step which, if said given position index belongs to no set amongst said first and second sets of N position indices, and if the symbols in the first and second copies received possess a same value, is a step for choosing said same value.

8. Method according to claim 6, wherein it furthermore comprises steps which, if said given position index belongs to no set amongst said first and second sets of equal to one or more position indices, are steps for:
 obtaining, for each received copy whose symbol positioned at said given position index is a remaining symbol such that the given position index does not belong to the set of N position indices obtained for each received copy, a level of overall reliability associated with said received copy;
 choosing, for said symbol positioned at said given position index in said copy to be decoded, the value of the remaining symbol which is included in the received copy associated with the greatest level of overall reliability obtained.

9. Method according to claim 1, wherein it comprises steps for:
 checking to see whether a total number of one or more erasures marked in said erasures vector is greater than a maximum predetermined number S;
 and in the event of a positive verification:
 resetting the erasures vector in eliminating the pre-marked erasure(s);
 building a list of position indices for which an erasure has been pre-marked in the erasures vector;
 associating, with each position index of the list, the highest level of reliability amongst those associated with the symbols positioned at said position index in the received copies;
 classifying the list by rising order of levels of reliability associated with the position indices;
 marking an erasure for the S first position indices of the classified list;
 choosing, for each other position index of the classified list not marked as an erasure, for the symbol positioned at said position index in said copy to be decoded, the value of the symbol for which the level of reliability is the highest amongst the levels of reliability of the symbols positioned at said position index in the received copies.

10. Method according to claim 9, wherein said predetermined maximum number S of erasures is smaller than or equal to a limit capacity of correction of said error correction code.

11. Method according to claim 1, wherein the decoder of the first type is a block decoder and the decoder or decoders of the second type i/are a convolutive decoder or convolutive decoders.

12. Computer-readable storage means storing a computer program comprising a set of instructions executable by a computer for implementing a method for determining a copy to be decoded and an associated erasures vector by means of a receiver device receiving at least two copies of a same piece of data encoded according to an error correction code, each received copy comprising several symbols, each associated with a position index in said copy, said copy to be decoded being designed to be decoded in taking account of the erasures vector by means of a decoder of a first type applying a decoding adapted to the error correction code, said method wherein it comprises steps for:
  obtaining, for at least one symbol of each copy received, a level of reliability of transmission associated with said symbol;
  marking or not marking, for at least one given position index associated with a symbol included in said copy to be decoded, an erasure for said given position index in said erasures vector as a function of the reliability levels associated with the symbols which are positioned at said given position index in said received copies.

13. Receiver device adapted to determining a copy to be decoded and an associated erasures vector, said receiver device receiving at least two copies of a same piece of data encoded according to an error correction code, each received copy comprising several symbols, each associated with a position index in said copy, said copy to be decoded being designed to be decoded in taking account of the erasures vector by means of a decoder of a first type applying a decoding adapted to said error correction code. said receiver device wherein it comprises:
  means for obtaining, for at least one symbol of each copy received, a level of reliability of transmission associated with said symbol;
  means for marking, for at least one given position index associated with a symbol included in said copy to be decoded, an erasure for said given position index in said erasures vector as a function of the reliability levels associated with the symbols which are positioned at said given position index in said received copies.

* * * * *